United States Patent [19]

Komaki et al.

[11] Patent Number: 5,273,618

[45] Date of Patent: * Dec. 28, 1993

[54] APPARATUS FOR VAPOR-PHASE SYNTHESIS OF DIAMOND AND METHOD FOR VAPOR-PHASE SYNTHESIS OF DIAMOND

[75] Inventors: Kunio Komaki, Tokyo; Yoichi Hirose, 358-225, Showa-machi Komejima, Kitakatsushika-gun, Saitama, both of Japan

[73] Assignees: Showa Denko K.K., Tokyo; Masao Murakawa; Yoichi Hirose, both of Saitama, all of Japan

[*] Notice: The portion of the term of this patent subsequent to Jul. 3, 2007 has been disclaimed.

[21] Appl. No.: 721,549

[22] PCT Filed: Nov. 28, 1990

[86] PCT No.: PCT/JP90/01545

§ 371 Date: Jul. 25, 1991

§ 102(e) Date: Jul. 25, 1991

[87] PCT Pub. No.: WO91/08329

PCT Pub. Date: Jun. 13, 1991

[30] Foreign Application Priority Data

Nov. 28, 1989 [JP] Japan ............................ 1-306613
Sep. 7, 1990 [JP] Japan ............................ 2-238777

[51] Int. Cl.$^5$ .................................................. C30B 29/04
[52] U.S. Cl. ................................... 156/613; 118/716; 156/614; 156/DIG. 68; 423/446

[58] Field of Search ................ 118/47, 716, 728; 156/613, 614, DIG. 68, DIG. 73; 423/446

[56] References Cited

U.S. PATENT DOCUMENTS

| | | | |
|---|---|---|---|
| 4,938,940 | 7/1990 | Hirose et al. | 423/446 |
| 5,068,871 | 11/1991 | Uchida et al. | 423/446 |
| 5,075,096 | 12/1991 | Tanabe et al. | 423/446 |

FOREIGN PATENT DOCUMENTS

| | | | |
|---|---|---|---|
| 1-282193 | 11/1989 | Japan . | |
| 2-192491 | 7/1990 | Japan | 156/DIG. 68 |
| 2-196094 | 8/1990 | Japan | 156/DIG. 68 |

*Primary Examiner*—Robert Kunemund
*Assistant Examiner*—Felisa Garrett
*Attorney, Agent, or Firm*—Oblon, Spivak, McClelland, Maier & Neustadt

[57] ABSTRACT

An apparatus for the synthesis of diamond by the vapor-phase process using a combustion flame is provided with a cover set in place in the peripheral region of a combustion burner for enveloping the combustion flame and provided, when necessary, with gas inlets. A method for the synthesis of diamond by the vapor-phase process using the apparatus described above effects the diamond deposition by forming a combustion flame for synthesis of diamond and, at the same time, varying the relative parallel positions of the combustion flame and the substrate.

10 Claims, 1 Drawing Sheet

APPARATUS FOR VAPOR-PHASE SYNTHESIS OF DIAMOND AND METHOD FOR VAPOR-PHASE SYNTHESIS OF DIAMOND

TECHNICAL FIELD

This invention relates to an apparatus for synthesizing by the vapor phase process diamond substances of a large surface area possessing such characteristics as wearproofness, corrosionproofness, high thermal conductivity, and high specific elasticity and showing usefulness for abrasive, grinding agent, optical materials, carbide tool, sliding materials, corrosionproofing materials, acoustic vibration materials, and material for blade edges and to a method for the synthesis of diamond substances by the vapor phase process.

BACKGROUND ART

As methods for the synthesis of diamond, there have heretofore been practically adopted the method for the direct conversion of graphite including the method which effects the synthesis under an ultrahigh pressure in the presence of an iron or nickel catalyst and the method which accomplishes the synthesis with the aid of an explosive.

In recent years, as a low-pressure CVD method, the method which attains synthesis of diamond by setting a hydrocarbon or a mixed gas of hydrogen and an organic compound containing nitrogen, oxygen, etc. into an excited state by means of a hot filament, microwave plasma, high-frequency plasma, DC discharge plasma, or DC arc discharge, for example, has been developed.

The conventional CVD method mentioned above has necessitated a special device for the purpose of exciting the raw gas in such a manner as to permit synthesis of diamond. No matter which of the sources of excitation may be used, it is difficult to increase the surface area of diamond substances to be deposited.

The present inventors continued their studies with a view to developing a method liberated from the aforementioned drawbacks of the conventional CVD method and, as a result, developed a combustion flame method [Japanese Patent Public Disclosure HEI 1-282193].

This method, however, has the problem of practical utility because the diamond substances deposited by this method have only limited surface area. The present inventors, as the result of their studies continued with a view to developing a method for depositing diamond substances of a large surface area, have found that the deposition is easily accomplished by varying the parallel relative positions of a substrate and a burner thereby allowing the flame of combustion to contact the entire surface of the substrate. The invention embodying this knowledge has been applied for patent under Japanese Patent Application HEI 1-8091.

The method for synthesis of diamond by the use of combustion flame requires to burn a compound as a raw material for the deposition of diamond in such a manner as to give rise to a region of incomplete combustion in the atmosphere of combustion and place a substrate in the region of incomplete combustion or in a non-oxidizing atmosphere closely approximating the region. For the purpose of heightening the efficiency of deposition and the homogeneity of quality of diamond in the method of combustion flame, therefore, it is necessary during the combustion of the raw material for the formation of diamond to increase the amount of the raw material participating in the formation of the region of incomplete combustion to the fullest possible extent. From this point of view, the present inventors have continued their studies on the method of combustion flame in search of a way of enhancing the efficiency of deposition of diamond homogenizing the quality of deposited diamond.

DISCLOSURE OF THE INVENTION

As a result, they have found that this object is attained by disposing in the peripheral region of a combustion flame a cover adapted to prevent the combustion flame from being mixed with oxygen from the ambience and providing this cover with a gas inlet. This invention has been perfected consequently.

To be specific, this invention relates to an apparatus for the synthesis of diamond by the vapor-phase process having as the main component elements thereof a combustion burner for synthesis of diamond and a substrate for deposition of diamond, characterized in that a cover for enveloping a combustion flame from the burner is disposed in the peripheral region of the burner in such a manner as to prevent oxygen from the ambience from mingling into the combustion flame and the cover is provided with a gas inlet and to a method for the synthesis of diamond by the vapor-phase process in an apparatus for the synthesis of diamond having as the main component elements thereof a combustion burner for synthesis of diamond and a substrate for deposition of diamond and having disposed in the peripheral region of the burner a cover for enveloping the combustion flame from the burner in such a manner as to prevent oxygen from the ambience from mingling into the combustion flame, characterized in that the deposition of diamond on the substrate is attained by causing the burner to form a combustion flame for the synthesis of diamond and, at the same time, varying the relative parallel positions of the combustion flame and the substrate.

BEST MODE FOR CARRYING OUT THE INVENTION

Figure 1:
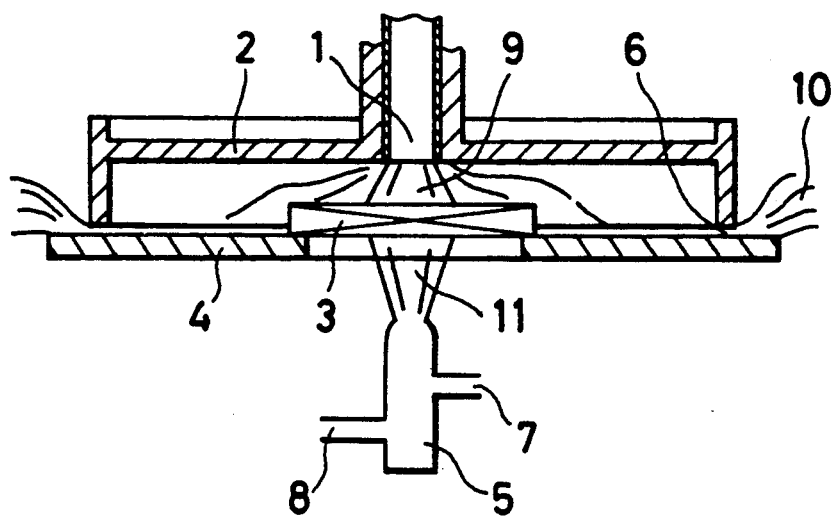
FIG. 1 is a cross section illustrating an example of the apparatus of this invention for the synthesis of diamond by the vapor-phase process.

In the synthesis of diamond by the apparatus of this invention, since the cover is disposed in the peripheral region of the combustion flame, the diffusion of oxygen from the ambience into the peripheral region of the combustion flame is repressed and the diminution or extinction of an outer flame part is realized.

In the apparatus of this invention, when the cover is provided with a gas inlet, the diffusion of oxygen gas, etc. in the cover interior is prevented more effectively by introducing hydrogen or at least one inert gas such as argon or nitrogen into the cover interior via the gas inlet.

Though the location of the gas inlet is not particularly specified, it is practical to have a plurality of gas inlets disposed as spaced regularly, for example, in the vicinity of burner opening.

The combustion burner is generally disposed in such a manner that the combustion flame rises at an angle of 90° relative to the substrate, i.e. on or parallelly to the perpendicular line of the cover. The quality of the diamond to be formed is improved by having the combustion burner disposed diagonally relative to the perpendicular line. This diagonal disposition also serves to facilitate the deposition of diamond in the opposite lateral parts of the substrate. The angle of this inclination is desired to be not more than 60°, preferably to be in the range of 40° to 50°, relative to the perpendicular line.

It has been found that in the apparatus of this invention, the deposition of diamond substances large in surface area and homogeneous in quality is attained and the uniformity of the strength of adhesion of the diamond substances to the substrate is enhanced by moving either of the substrate and the device for combustion flame.

This invention will be described with reference to the drawings depicting one embodiment of the present invention. These drawings illustrate only the parts of burner, cover, and substrate for deposition of diamond substances. In the diagrams, 1 stands for a burner opening, 2 for a cover seated contiguously to the outer side of the burner, 3 for a substrate for deposition of diamond substances, 4 for a substrate supporting base, 5 for a spray gun for cooling the substrate, 6 for a gap intervening between the cover and the substrate supporting base, 7 and 8 respectively for a refrigerant (such as, for example, water) pipe led to the spray gun and an inert gas (such as, for example, argon) pipe, 9 for a combustion flame, 10 for a secondary combustion flame protruding from the cover via the gap 6, and 11 for a jet of water for cooling the substrate 3.

As illustrated, the combustion flame 9 of a gas for formation of diamond is formed through the burner opening 1 and, at the same time, the refrigerant (having water as a main component thereof) is sprayed onto the reverse surface of the substrate 3 to adjust the temperature of the substrate. The gap 6 of a small size intervenes between the cover 2 and the substrate supporting base 4. Since the combustion flame has no other path than the gap 6 for contact with the ambient air, the possibility of oxygen from the ambient air diffusing inside the cover and mingling with the combustion flame is virtually absent. The secondary combustion flame 10 blows out through this gap.

Figure 2:
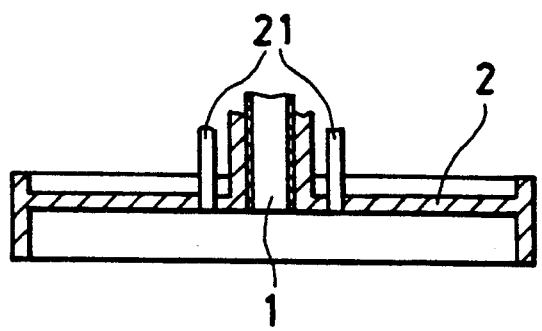
FIG. 2 is a cross section illustrating one example of the cover provided with a gas inlet and used in the apparatus of this invention for the synthesis of diamond by the vapor-phase process.

The prevention of the diffusion of oxygen inside the cover is attained more effectively by providing the cover with a gas inlet 21 as illustrated in FIG. 2 and supplying hydrogen or an inert gas such as argon, or nitrogen, for example, into the interior of the cover through the gas inlet 21.

Figure 3:
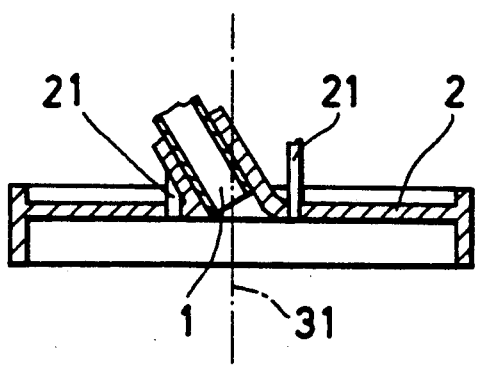
FIG. 3 is a cross section of the apparatus of this invention for the synthesis of diamond by the vapor-phase process, depicting the fact that a burner opening is formed as inclined relative to the perpendicular line of the cover.

The quality of the diamond to be produced is further improved by using the apparatus which is provided with a burner opening inclined relative to a perpendicular line 31 of the cover as illustrated in FIG. 3.

The amount of the gas to be introduced through the gas inlet is desired to be in the range of 5 to 70% by volume, based on the amount of the carbon-containing gas for the formation of the combustion flame.

When the method of this invention is carried out using the apparatus of this invention, the diamond is deposited in a high yield on the substrate because the interior of the cover is formed substantially wholly of a region of incomplete combustion.

In the conventional coverless combustion device, when the combustion is effected with the distance between the substrate and the burner kept in the range of 3 to 20 mm, for example, an automorphic diamond film is formed as centered around the position on the substrate corresponding to the center of the burner and the DLC (diamond-like carbon) is deposited along the periphery of the diamond film and soot is deposited further along the periphery of the ring of DLC.

In the case of this method, when the diamond of a large surface area is deposited on the surface of the substrate by moving the burner, the soot in the outermost peripheral region ceases to exist but the DLC is hard to disappear. When the deposition of diamond is tried by the conventional method using the coverless apparatus as described above, since the diamond is deposited on the DLC, the deposited diamond film is very easily separated by virtue of the difference of component.

In contrast, when the method of this invention is carried out in the apparatus of this invention, the extinction of the soot occurs similarly to the conventional apparatus using a coverless burner and the extinction of the DLC is effected by a mechanism presumably ascribable to the reaction of gasification with the reducing flame. When the introduction of the gas is carried out, the deposition of the DLC is repressed and the effect of the cover is enhanced. As a result, the diamond is always deposited directly on the surface of the substrate. This fact can be confirmed by means of a window formed in the cover so as to allow visual observation of the surface of the substrate. This phenomenon indicates that the diamond deposited on the surface of the substrate in accordance with the present invention exhibits high adhesive strength to the surface of the substrate and only a small fluctuation of film thickness as compared with the diamond deposited by the conventional method with the apparatus using a coverless burner.

The temperature of the substrate, the speed of the burner movement, etc. in the actual deposition of diamond on the substrate in the apparatus of the present invention are substantially identical with those used in the conventional method. Specifically, the temperature of the substrate is in the range of 600° to 1,200° C. and the speed of the burner movement in the range of 0.1 to 10 mm/minute, preferably 0.3 to 3.0 mm/minute.

Now, the present invention will be described below with reference to working examples and a comparative experiment.

EXAMPLE 1

An apparatus of this invention illustrated in FIG. 1 was used.

To an ordinary oxygen/acetylene burner 14 mm in diameter, a cover made of copper and measuring 160 mm in diameter and 10 mm in height and forming a gap of 5 mm between a substrate and a burner opening was attached as illustrated. A tungsten plate measuring 50×50×5 mm and intended for deposition of diamond was set in place as illustrated. A spray gun was supplied with water and argon and the burner was fed with acetylene gas at a rate of 6.0 liters/minute and with oxygen at a rate of 5.3 liters/minute (oxygen/acetylene ratio 0.89) to form a combustion flame and keep the temperature of the substrate at 800° C. The burner was advanced straight on the surface of the substrate at a rate of 2 mm/minute, thereafter moved at right angles within the same plane and further moved (100 mm) in the reverse direction. By repeating this movement, the burner was reciprocated two and a half times on the substrate to form a deposited film of diamond on the entire surface of the substrate. By observation with the unaided eye and with a microscope, the product of this deposition was confirmed to be a dense film having a thickness of 2 to 3 μm and formed of substantially uniform and highly automorphic diamond crystals. The Raman spectrum of this product showed a sharp peak at $1333^{-1}$ cm and a very broad and weak peak in the neighborhood of $1550^{-1}$ cm. The results indicate that the deposited film was composed of diamond of fine quality and included DLC in a very small amount.

EXAMPLE 2

An apparatus of this invention identical in construction with the apparatus of Example 1, except that a cover provided along the periphery of a burner opening with four regularly spaced gas inlets as illustrated in FIG. 2 was used instead. In this apparatus, the deposition of a synthetic diamond film was carried out by faithfully repeating the procedure of Example 1, except that hydrogen gas was introduced into the burner cover via the gas inlets at a rate of 3 liters/minute. The product of deposition obtained consequently had a thickness of 2.5 to 3.2 μm and was formed of substantially uniform and highly automorphic diamond crystals. The uniformity of these diamond crystals was higher than that of the diamond crystals obtained in Example 1. The Raman spectrum of this product showed a slightly sharper peak at 1333 $cm^{-1}$ and a low peak at 1550 $cm^{-1}$. These results indicate that the deposited film was composed of diamond of high quality and still contained a very small amount of DLC.

EXAMPLE 3

An apparatus of this invention identical in construction with the apparatus of Example 1, except that a cover provided with a burner opening inclined by 45° relative to the perpendicular line of the cover as illustrated in FIG. 3 was used instead. In this apparatus, the deposition of a synthetic film of diamond was carried out by repeating the procedure of Example 1. The deposited film had a thickness of 1.5 to 2.2 μm and was composed of highly uniform, automorphic, and translucent diamond crystals.

The diamond film was deposited also on the lateral sides of the substrate. The Raman spectrum of this product showed a sharp peak at 1333 $cm^{-1}$. It showed no peak at 1550 $cm^{-1}$. The results indicate that the film was composed of diamond of very high quality.

COMPARATIVE EXPERIMENT

Deposition of diamond on a substrate was effected by forming a combustion flame with a burner by repeating the procedure of Example 1, except that the apparatus used was provided with no cover. The product on the substrate separated when it was cooled. By the observation of the separated part with the unaided eye and with a microscope, it was confirmed that diamond was deposited on DLC which was deposited on the substrate. By the analysis of the Raman spectrum of the product, it was confirmed that the part which the core of the combustion flame touched was formed of diamond and the DLC content increased in proportion as the distance from the core increased.

INDUSTRIAL APPLICABILITY

This invention allows diamond substances of a large surface area, uniform in thickness and homogeneous and excellent in quality, to be produced in a high yield and in a large amount by the CVD method as compared with the conventional method.

We claim:

1. An apparatus for the synthesis of diamond by a vapor-phase process, which comprises:

a combustion burner having a burner opening for synthesis of diamond;

a substrate for deposition of diamond;

a base for supporting said substrate thereon; and a cover for enveloping a combustion flame from said burner, said cover being connected to said burner opening and disposed movably in parallel to said substrate to move the combustion flame in parallel to said substrate, said cover having an edge forming in cooperation with said base a gap for allowing a secondary combustion flame to protrude from said gap, thereby preventing oxygen from the ambience from mingling into the combustion flame.

2. An apparatus according to claim 1, wherein said cover is provided with a gas inlet for preventing oxygen from the ambient air from being diffused inside the cover.

3. An apparatus according to claim 2, wherein a plurality of gas inlets are disposed as spaced regularly along the peripheral region of an opening of the combustion burner.

4. An apparatus according to claim 1, wherein said combustion burner is inclined relative to the perpendicular line of the cover.

5. An apparatus according to claim 2, wherein said combustion burner is inclined relative to the perpendicular line of the cover.

6. A method for the synthesis of diamond by a vapor-phase process using an apparatus which comprises a combustion burner having a burner opening for synthesis of diamond, a substrate for deposition of diamond, a base for supporting the substrate thereon, and a cover for enveloping a combustion flame from the burner, the cover being connected to the burner opening and disposed movably in parallel to the substrate to move the combustion flame in parallel to the substrate, said cover having an edge forming in cooperative with the base a gap for allowing a secondary combustion flame to protrude from the gap, thereby preventing oxygen from the ambience form mingling into the combustion flame, said method comprising the steps of:

forming from the burner a combustion flame for synthesis of diamond; and simultaneously moving the formed combustion flame as held in parallel to the substrate, thereby depositing diamond on the substrate.

7. A method according to claim 6, wherein said combustion burner is inclined relative to the perpendicular line of the cover.

8. A method for the synthesis of diamond by a vapor-phase process using an apparatus which comprises a combustion burner having a burner opening for synthesis of diamond, a substrate for deposition of diamond, a base for supporting the substrate thereon, and a cover for enveloping a combustion flame from the burner, the cover being provided with a gas inlet, connected to the burner opening and disposed movably in parallel to the substrate to move the combustion flame in parallel to the substrate, said cover having an edge forming in cooperation with the base a gap for allowing a secondary combustion flame to protrude from the gap, thereby preventing oxygen from the ambience from mingling into the combustion flame, said method comprising the steps of:

introducing at least one of hydrogen and inert gas through the gas inlet while forming from the burner a combustion flame for synthesis of diamond; and simultaneously moving the formed combustion flame in parallel to the substrate, thereby depositing diamond on the substrate.

9. A method according to claim 8, wherein a plurality of gas inlets are disposed as spaced regularly along the peripheral region of an opening of the combustion burner.

10. A method according to claim 8, wherein said combustion burner is inclined relative to the perpendicular line of the cover.

* * * * *